United States Patent
Koch et al.

(10) Patent No.: US 12,372,431 B2
(45) Date of Patent: Jul. 29, 2025

(54) METHOD FOR DETERMINING AN IMAGING QUALITY OF AN OPTICAL SYSTEM WHEN ILLUMINATED BY ILLUMINATION LIGHT WITHIN A PUPIL TO BE MEASURED

(71) Applicant: Carl Zeiss SMT GmbH, Oberkochen (DE)

(72) Inventors: Markus Koch, Neu-Ulm (DE); Renzo Capelli, Heidenheim (DE); Klaus Gwosch, Aalen (DE); Dmitry Simakov, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 323 days.

(21) Appl. No.: 17/750,947

(22) Filed: May 23, 2022

(65) Prior Publication Data
US 2022/0390320 A1  Dec. 8, 2022

(30) Foreign Application Priority Data

May 26, 2021 (DE) .......................... 102021205328.9

(51) Int. Cl.
  *G01M 11/02* (2006.01)
  *G03F 1/84* (2012.01)
(52) U.S. Cl.
  CPC ........ *G01M 11/0207* (2013.01); *G01M 11/02* (2013.01); *G01M 11/0264* (2013.01); *G03F 1/84* (2013.01)
(58) Field of Classification Search
  CPC ............. G01M 11/0207; G01M 11/02; G01M 11/0264; G03F 1/84; G03F 7/70666
  See application file for complete search history.

(56) References Cited

U.S. PATENT DOCUMENTS 10,068,325 B2 * 9/2018 Matejka ................ G02B 21/361
11,526,086 B2 * 12/2022 Hill ...................... G01N 21/9501
(Continued)

FOREIGN PATENT DOCUMENTS

DE   102 20 815    11/2003    ............... G21K 7/00
DE   102 20 816    11/2003    ............... G21K 7/00
(Continued)

OTHER PUBLICATIONS

The Office Action and Search Report issued by the Taiwanese Patent Office for Application No. TW 111 119 349, dated Feb. 22, 2023 (with English Machine Translation).
(Continued)

*Primary Examiner* — Tarifur R Chowdhury
*Assistant Examiner* — Joshua M Carlson
(74) *Attorney, Agent, or Firm* — Fish & Richardson P.C.

(57) ABSTRACT

To determine an imaging quality of an optical system when illuminated by illumination light within a pupil to be measured of the optical system and/or to qualify the phase effect of a test structure, a test structure that is periodic in at least one dimension is initially arranged in an object plane of the optical system. An initial illumination angle distribution for illuminating the test structure with an initial pupil region, whose area is less than 10% of a total pupil area, is specified and the test structure is illuminated thereby in different distance positions relative to the object plane. In this way, an initial measured aerial image of the test structure is determined. Specifying the illumination distribution, illuminating and determining the aerial image are then repeated for a further illumination angle distribution and an imaging contribution of the optical system is determined from a comparison of the measured aerial images, the imaging quality parameter to be determined and/or a complex-valued diffraction spectrum of the test structure being determined from (Continued)

said imaging contribution. A metrology system for carrying out the method comprises a holder for the test structure, an illumination optical unit, a specification device for specifying the illumination angle distributions, the optical system to be examined in respect of its imaging quality, and a spatially resolving detection device for determining aerial images. This yields an improved imaging quality determination method.

26 Claims, 9 Drawing Sheets

(56) References Cited

U.S. PATENT DOCUMENTS

| | | | | |
|---|---|---|---|---|
| 2010/0119143 | A1* | 5/2010 | Preil | G06T 7/001 |
| | | | | 382/144 |
| 2013/0063716 | A1 | 3/2013 | Mann et al. | |
| 2013/0083321 | A1 | 4/2013 | Wack et al. | |
| 2013/0308125 | A1* | 11/2013 | Perlitz | G03F 1/84 |
| | | | | 356/237.4 |
| 2013/0321609 | A1* | 12/2013 | Seitz | G02B 21/361 |
| | | | | 359/385 |
| 2017/0132782 | A1 | 5/2017 | Matejka et al. | |
| 2018/0095358 | A1 | 4/2018 | Seitz et al. | |
| 2018/0357758 | A1 | 12/2018 | Matejka et al. | |
| 2019/0258180 | A1* | 8/2019 | Koch | G03F 1/44 |
| 2019/0391087 | A1* | 12/2019 | Matejka | G01B 9/02083 |
| 2020/0081350 | A1* | 3/2020 | Gruner | G02B 17/0657 |
| 2020/0218160 | A1 | 7/2020 | Kruithof et al. | |
| 2020/0297208 | A1* | 9/2020 | Lapointe | A61B 5/1455 |
| 2021/0072021 | A1 | 3/2021 | Hill et al. | |
| 2022/0334493 | A1* | 10/2022 | Liu | G03F 7/70441 |

FOREIGN PATENT DOCUMENTS

| | | | | |
|---|---|---|---|---|
| DE | 103 17 366 | | 11/2004 | ............ G01M 11/02 |
| DE | 102013219524 | | 4/2015 | ............ G01M 11/02 |
| DE | 102016218977 | | 4/2018 | ............... G03F 1/36 |
| DE | 102017216703 | | 3/2019 | ............... G03F 7/20 |
| DE | 102017221005 | A1 * | 5/2019 | ............ G01M 11/02 |
| DE | 102018211895 | | 9/2019 | ............ G01M 11/02 |
| DE | 102019215800 | | 4/2021 | ................ G01J 9/00 |
| JP | 2002-022609 | | 1/2002 | ............ G01M 11/02 |
| JP | 2004-140390 | | 5/2004 | .......... H01L 21/027 |
| JP | 2015-503231 | | 1/2015 | .......... H01L 21/027 |
| JP | 2015-517095 | | 6/2015 | ............ G01M 11/02 |
| TW | 200402529 | | 2/2004 | ............. G01B 11/24 |
| TW | 202037885 | | 10/2020 | ............. G01B 11/27 |
| TW | 202117275 | | 5/2021 | ............. G01B 11/25 |
| WO | WO 03/106916 | | 12/2003 | |
| WO | WO 2008/025433 | | 3/2008 | ................ G01J 9/00 |
| WO | WO 2013/075930 | | 5/2013 | ............... G03F 7/20 |
| WO | WO 2013/139483 | | 9/2013 | ............... G03F 7/20 |
| WO | WO 2015/044362 | | 4/2015 | ............ G01M 11/02 |
| WO | WO 2016/012426 | | 1/2016 | ............. G02B 17/08 |
| WO | WO 2017/207297 | | 12/2017 | ............... G03F 1/84 |
| WO | WO 2020/106335 | | 5/2020 | ............. G01B 11/27 |

OTHER PUBLICATIONS

The European Search Report issued by the European Patent Office for Application No. EP 22 17 4035, dated Oct. 12, 2022 (with English Machine Translation).
Office Action issued by the Japanese Patent Office for Application No. JP 2022-085924, dated Jul. 20, 2023 (with English Translation).
The Office Action issued by the German Patent Office for Application No. DE 10 2021 205 328.9, dated Feb. 18, 2022 (with English Translation).
Martin et al., "WLCD: A new System for Wafer Level CD Metrology on Photomasks", *Proceedings of SPIE*, (Mar. 2009).

* cited by examiner

METHOD FOR DETERMINING AN IMAGING QUALITY OF AN OPTICAL SYSTEM WHEN ILLUMINATED BY ILLUMINATION LIGHT WITHIN A PUPIL TO BE MEASURED

CROSS-REFERENCE TO RELATED APPLICATION

The present patent application claims the priority of the German patent application DE 10 2021 205 328.9, filed on May 26, 2021, the content of which is incorporated herein by reference in its entirety.

TECHNICAL FIELD

The invention relates to a method for determining an imaging quality of an optical system when illuminated by illumination light within a pupil to be measured of the optical system. Further, the invention relates to a metrology system for carrying out such a method. As an alternative or in addition to determining the imaging quality, the described method facilitates the qualification of the effect of the test structure on the phase of the light.

BACKGROUND

Such a method and a metrology system to this end are known from DE 10 2019 215 800 A1. A metrology system for measuring an aerial image of a lithography mask in three dimensions is known from WO 2016/012 426 A1. DE 10 2013 219 524 A1 describes a device and a method for determining an imaging quality of an optical system, and an optical system. DE 10 2013 219 524 A1 has described a phase retrieval method for determining a wavefront on the basis of the imaging of a pinhole. The specialist article "WLCD: A new system for a wafer level CD metrology on photomasks," Proceedings of SPIE—The International Society for Optical Engineering, 2009, 7272, by Martin et al. has disclosed a metrology system for determining a wafer level critical dimension (CD).

SUMMARY

It is an aspect of the present invention to improve a method for determining the imaging quality of an optical system.

This aspect is achieved according to the invention by a determination method having the features specified in claim 1.

According to the invention, it was recognized that the use of a periodic test structure for determining an imaging contribution of the optical system and/or for qualifying the effect of the test structure on the phase of the light generates boundary conditions which, depending on the design of the determination method, either increase the accuracy with which the imaging quality is determined or increase the speed with which the imaging quality is determined. The pupil to be measured can be an exit pupil of the optical system and, in particular, the exit pupil of a projection optical unit. A complex mask spectrum can be determined for the purposes of qualifying the effect of the test structure on the phase of the light. The test structure can be periodic in exactly one dimension (1-D test structure). Alternatively, the test structure can also be periodic in more than one dimension, for example in two dimensions (2-D test structure).

Further boundary conditions which improve the determination method in respect of its accuracy and/or in respect of its speed arise by specifying illumination angle distributions with a small pupil region in comparison with the pupil. The area of this pupil region can be smaller than 5% of the total pupil area and can for example be no more than 4% of the total pupil area. The area of the pupil region is regularly greater than 0.001% of the total pupil area of the pupil.

By using an illumination of the test structure that is correspondingly well defined in respect of its direction, it is possible to ensure that, for example, diffraction effects at the test structure can be separated from imaging effects of the optical system to be measured.

Other than knowledge about the periodicity of the test structure, in particular knowledge of the structure period, no further prior knowledge about the test structure is required for carrying out the determination method. The period can be determined in turn within the determination method by way of known diffraction measuring steps.

A projection optical unit for imaging an object field in the object plane into an image field in the image plane can represent the optical system whose imaging quality is intended to be determined or can be a constituent part of such an optical system.

By way of example, the determination method can be used to determine a phase difference between an absorber and a multilayer of a lithography mask from the diffraction spectrum of said mask. A corresponding determination of the phase difference is described in DE 10 2019 215 800 A1 and in WO 2008 025 433 A2. The entire disclosures of DE 10 2019 215 800 and WO 2008 025 433 are herein incorporated by reference. The optical system can then be adjusted and/or corrected on the basis of the determined imaging quality. A further application of the determined imaging quality is a synthetic calculation of aerial images in a photoresist of a mask; cf., WO 2017 207 297 A1, the entire disclosure of which is herein incorporated by reference. A further application is the calculation of what is known as an optical proximity correction model. In this respect, reference is made to DE 10 2016 218 977 A, the entire disclosure of which is herein incorporated by reference.

An at least approximately circular pupil and/or an at least approximately circular pupil region or an elliptical pupil region as claimed in claim 2 simplify the determination method. To the extent that the pupil and/or the pupil region deviate from a circular form, a radius of the pupil and/or a radius of the pupil region can be calculated as a mean radius. An upper limit for the radius of the pupil region that represents the respective illumination angle distribution can be 25%, 20%, 15% or else 10% of a radius of the pupil, or it can be even smaller.

A repetition of the method steps as claimed in claim 3 leads to an improvement in a determination method accuracy. In principle, the method can also be carried out with exactly two illumination angle distributions, for example with an initial illumination angle distribution with a central illumination of the pupil and with exactly one illumination angle distribution that has been displaced in relation to this initial illumination angle distribution.

Measuring a measured spectrum as claimed in claim 4 contains the acquisition of information in relation to the pure diffraction spectrum of the periodic test structure and in relation to a transfer function of the optical system. In the determination method, this can be used to separate components of the pure diffraction spectrum of the periodic test structure from the measured spectrum that has been measured such that the transfer function of the optical system and hence the imaging contribution of the optical system remains.

A determination of the imaging contribution as claimed in claim 5 simplifies the determination method. Such a pure displacement of a diffraction spectrum in the pupil is known in the context of the Hopkins approximation. In this respect, reference is also made to US 2019/0391087 A1 (the entire disclosure of which is herein incorporated by reference) and the citations specified therein.

A further simplification arises in the determination method as claimed in claim 6.

A reconstruction as claimed in claim 7 increases the quality of the determination method.

This applies, in particular, to a reconstruction method as claimed in claim 8. Minimizing the difference between a measured aerial image and an aerial image dependent on the measured spectrum to be reconstructed is described in DE 10 2019 215 800 A1.

A reconstruction of the transfer function as claimed in claim 9 facilitates an evaluation, for example of an apodization of the optical system by way of the amplitude of the transfer function or of a wavefront aberration of the optical system by way of the phase of the transfer function. The apodization and the wavefront aberration are examples of the imaging quality parameter determined from the determined imaging contribution. A diffraction spectrum of the periodic test structure can be reconstructed when determining an imaging contribution for the purposes of determining the imaging quality.

Specifying the illumination angle distributions in the style of claim 10 simplifies the determination method. In the case of several repetitions of the specification of a further illumination angle distribution in each case, it is possible for all respective pupil regions to be spaced apart by in each case exactly one order of diffraction of the diffraction spectrum of the respectively adjacent pupil region. When a 2-D test structure is used, the distance can be present in each case as exactly one order of diffraction or an integer multiple thereof along both 2-D coordinates.

Spacing by an integer multiple of an order of diffraction is also possible.

Specifying a pupil region as claimed in claim 11 facilitates the detection of a greatest possible number of orders of diffraction.

Specifying the respective illumination angle distribution as claimed in claim 12 has proven its worth in practice. The stop can be arranged in a pupil plane of an illumination optical unit in front of the optical system.

The advantages of a metrology system as claimed in claim 13 correspond to those that have already been explained above with reference to the determination method. Once the imaging quality of the optical system has been determined in the metrology system with the aid of the determination method, the metrology system can subsequently be used to determine a structure of a test structure which is still unknown in respect of its structure and which is for example non-periodic, this being due to the imaging quality having then been determined and it being possible to separate an apparatus function of the metrology system from the structure influences of the test structure.

The advantages of a specification device as claimed in claim 14 correspond to those which were already explained above with reference to the determination method. A stop aperture can be specifiable in variable fashion, for example in the style of an iris diaphragm. The stop can be displaceable in at least one lateral direction. By way of example, the stop can be displaceable in two mutually perpendicular lateral directions, which is advantageous, in particular, when a 2-D test structure is used.

A light source as claimed in claim 15 can be embodied as an EUV light source. An EUV wavelength of the light source can range between 5 nm and 30 nm. A light source in the DUV wavelength range, for example of the order of 193 nm, is also possible.

BRIEF DESCRIPTION OF DRAWINGS

Exemplary embodiments of the invention are explained below with reference to the drawings, in which.

DETAILED DESCRIPTION

Figure 1:
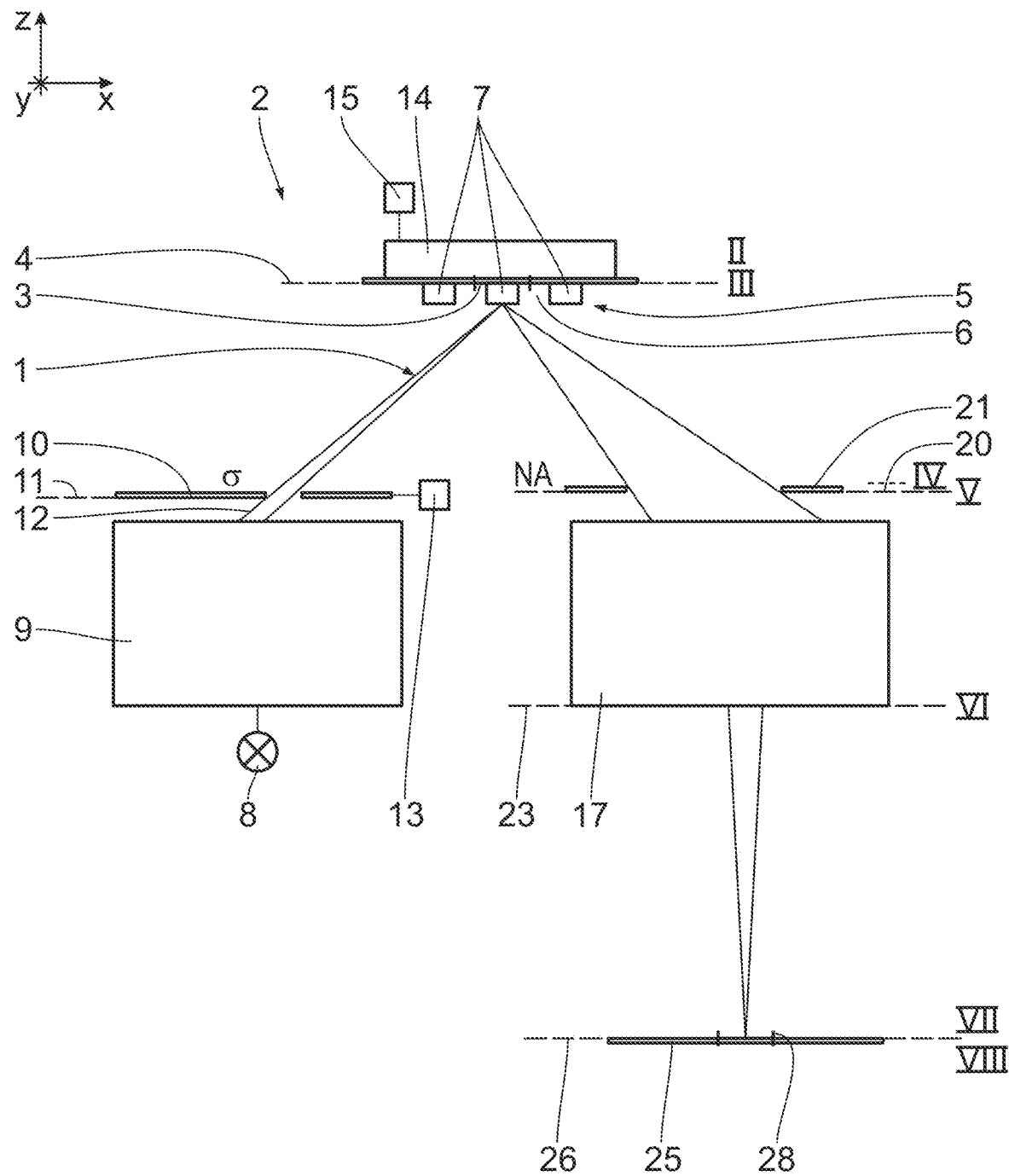
FIG. 1 very schematically shows a side view of a metrology system for determining an imaging quality of an optical system when illuminated with illumination light within a pupil to be measured of the optical system, comprising an illumination optical unit and an imaging optical unit, both of which are respectively represented very schematically.

In order to facilitate the representation of positional relationships, a Cartesian xyz-coordinate system is used hereinafter. The x-axis extends horizontally to the right in FIG. 1. The y-axis extends into the plane of the drawing at right angles to the latter in FIG. 1. The z-axis extends vertically upwards in FIG. 1.

In a view that corresponds to a meridional section, FIG. 1 shows a beam path of EUV illumination light or imaging light 1 in a metrology system 2 for determining an imaging quality of an optical system when illuminated by the illumination light 1 within a pupil to be measured. In this case, a test structure 5 arranged in an object field 3 in an object plane 4 is imaged.

Figure 2:
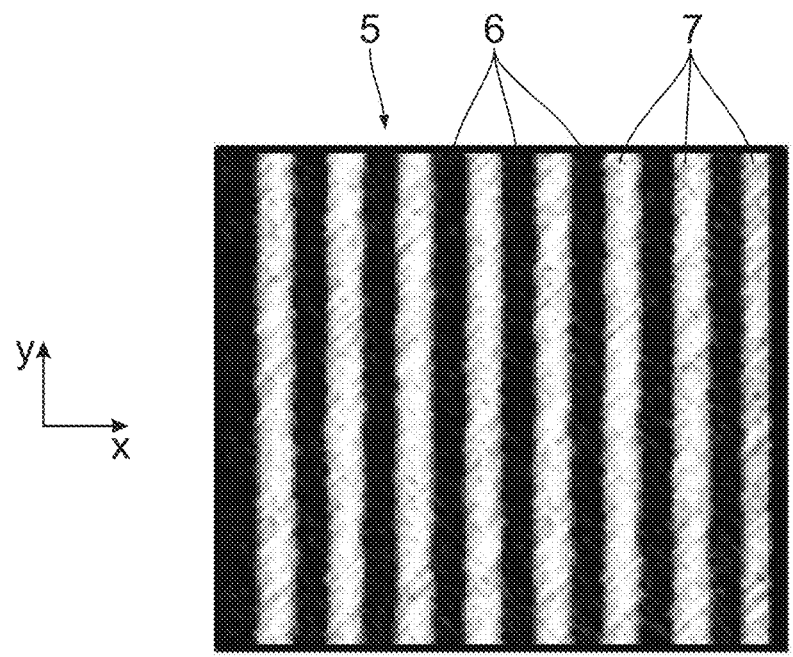
FIG. 2 shows a plan view of a binary, periodic test structure which is arranged at II in the metrology system according to FIG. 1.

The test structure 5 is depicted in a plan view in FIG. 2. The test structure 5 is periodic in one dimension, specifically along the x-coordinate. The test structure 5 is designed as a binary test structure with absorber lines 6 and respectively alternating multilayer lines 7 which reflect the illumination light 1. The lines 6, 7 are vertical structures.

The metrology system 2 is used to analyze a three-dimensional (3-D) aerial image (aerial image metrology system). Applications include the reproduction of an aerial image of a lithography mask, as the aerial image would also look in a producing projection exposure apparatus, for example in a scanner. To this end, it is necessary, in particular, to measure and optionally adjust an imaging quality of the metrology system 2 itself. Consequently, the analysis of the aerial image can serve to determine the imaging quality of a projection optical unit of the metrology system 2, or else to determine the imaging quality of, in particular, projection optical units within a projection exposure apparatus. Metrology systems are known from WO 2016/012 426 A1, from US 2013/0063716 A1 (cf., FIG. 3 therein), from DE 102 20 815 A1 (cf., FIG. 9 therein), from DE 102 20 816 A1 (cf., FIG. 2 therein) and from US 2013/0083321 A1.

The illumination light 1 is reflected and diffracted at the test structure 5. A plane of incidence of the illumination light 1 is parallel to the xz-plane in the case of the central, initial illumination.

The EUV illumination light 1 is produced by an EUV light source 8. The light source 8 can be a laser plasma source (LPP; laser produced plasma) or a discharge source (DPP; discharge produced plasma). In principle, a synchrotron-based light source can also be used, for example a free electron laser (FEL). A used wavelength of the EUV light source can range between 5 nm and 30 nm. In principle, in the case of a variant of the metrology system 2, a light source for another used light wavelength can also be used instead of the light source 8, for example a light source for a used wavelength of 193 nm.

An illumination optical unit 9 of the metrology system 2 is arranged between the light source 8 and the test structure 5. The illumination optical unit 9 serves for the illumination of the test structure 5 to be examined with a defined illumination intensity distribution over the object field 3 and at the same time with a defined illumination angle distribution with which the field points of the object field 3 are illuminated. Such an illumination angle distribution is also referred to as illumination setting.

The respective illumination angle distribution of the illumination light 1 is specified by way of a specification device 10, which is arranged in an illumination optical unit pupil plane 11. The specification device 10 is designed as an aperture stop, which delimits the edge of a beam of illumination light 1 incident thereon. The illumination angle distribution emerging on account of this delimitation is represented by a contiguous, fully illuminated pupil region, the area of which is less than 10% of a total pupil area of the used pupil of the optical system of the metrology system 2.

By way of example, if the used pupil has a normalized diameter of 1, a diameter of the illumination angle distribution as specified by the specification device 10 may be no more than 0.2 in a subsequent pupil plane of the optical system of the metrology system 2. In this case, the area of the fully illuminated pupil region is no more than 4% of the total pupil area.

The specification device 10 is designed as a stop which is displaceable in driven fashion and which is arranged in an illumination light beam path 12 of the illumination light 1 in front of the object plane 4. A drive unit used for the driven displacement of the specification device 10 is depicted at 13 in FIG. 1. By use of the drive unit 13, the specification device 10 can be displaced along the x-coordinate and/or along the y-coordinate. A fine adjustment along the z-coordinate for the purposes of adjusting a correspondence of an arrangement plane of the specification device 10 relative to the illumination optical unit pupil plane 11 is also possible. Moreover, the drive unit 13 can be designed such that a tilt of the stop about at least one tilt axis parallel to the x-axis and/or parallel to the y-axis is possible. A diameter of the aperture stop of the specification device 10 can also be adjustable and, in particular, specifiable in driven fashion.

The test structure 5 is held by an object holder 14 of the metrology system 2. The object holder 14 cooperates with an object displacement drive 15 for displacing the test structure 5, in particular along the z-coordinate.

Figure 3:
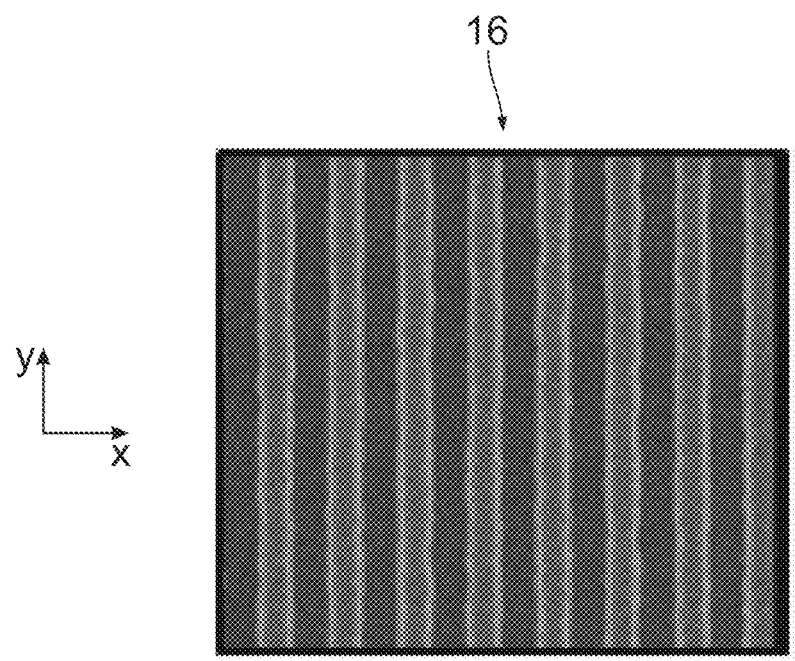
FIG. 3 shows, likewise in a plan view according to FIG. 2, a field distribution of an electromagnetic field of the illumination light in the illumination light beam path at III in FIG. 1, following an irradiation of the test structure.

Following reflection at the test structure 5, the electromagnetic field of the illumination light 1 has a distribution 16 which is represented in FIG. 3 in a plan view corresponding to that of FIG. 2. In the field distribution 16, amplitudes and phase values correspond to the absorber lines 6 and the multilayer lines 7 of the test structure 5.

The illumination light 1 reflected by the test structure 5 enters an imaging optical unit or projection optical unit 17 of the metrology system 2. The projection optical unit 17 is the optical system of the metrology system 2 that is intended to be examined in respect of its imaging quality.

Figure 4:
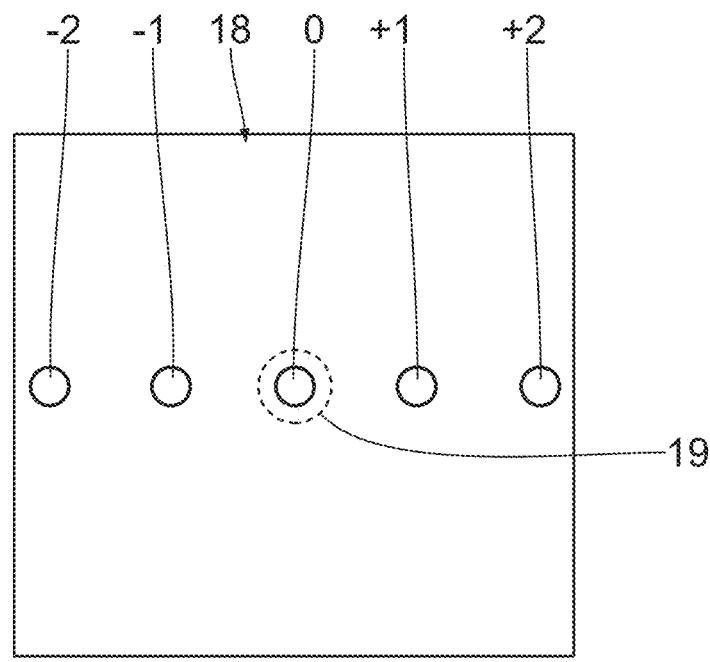
FIG. 4 shows, once again in a plan view according to FIG. 2, a diffraction spectrum of the test structure in the illumination light beam path at IV in FIG. 1.

A diffraction spectrum 18 arises in a pupil plane of the projection optical unit 17 on account of the periodicity of the test structure 5 (cf., FIG. 4).

In addition to the orders of diffraction of the diffraction spectrum 18, FIG. 4 also represents the initial pupil region 19 arising on account of the initial central illumination angle distribution of the metrology system 2. In respect of its size and relative position, this initial pupil region 19 corresponds to the pupil region which was specified by the specification device 10 in the illumination optical unit pupil plane 11 conjugate to the pupil plane of FIG. 11. The 0th order of diffraction of the test structure 5 is present in the diffraction spectrum 18 at the location of this specified pupil region 19. Moreover, FIG. 4 also reproduces the +/−1st order of diffraction and the +/−2nd order of diffraction of the diffraction spectrum 18.

The orders of diffraction of the diffraction spectrum 18 represented in FIG. 4 appear in this form in a pupil plane of the optical system of the metrology system 2, for example in an entrance pupil plane 20 of the projection optical unit 17. An aperture stop 21 of the projection optical unit 17, which delimits an entrance pupil 22 of the projection optical unit 17 at the edge, is arranged in this entrance pupil plane 20.

Figure 5:
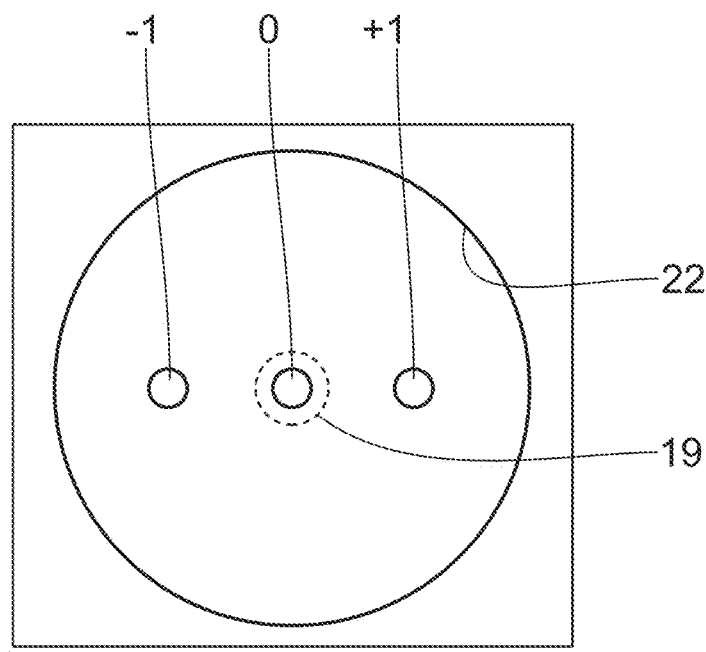
FIG. 5 shows, in a representation similar to FIG. 4, the diffraction spectrum that has been curtailed at the edge on account of an aperture stop of the metrology system, said aperture stop found at V in FIG. 1.

FIG. 5 shows the entrance pupil 22 and the three orders of diffraction of the diffraction spectrum 18 which are located within the entrance pupil 22 in the initial illumination angle distribution, specifically the 0th and the +/−1st orders of diffraction. Once again, FIG. 5 represents the initial pupil region 19, which is selected for illumination by way of the specification device 10.

Figure 6:
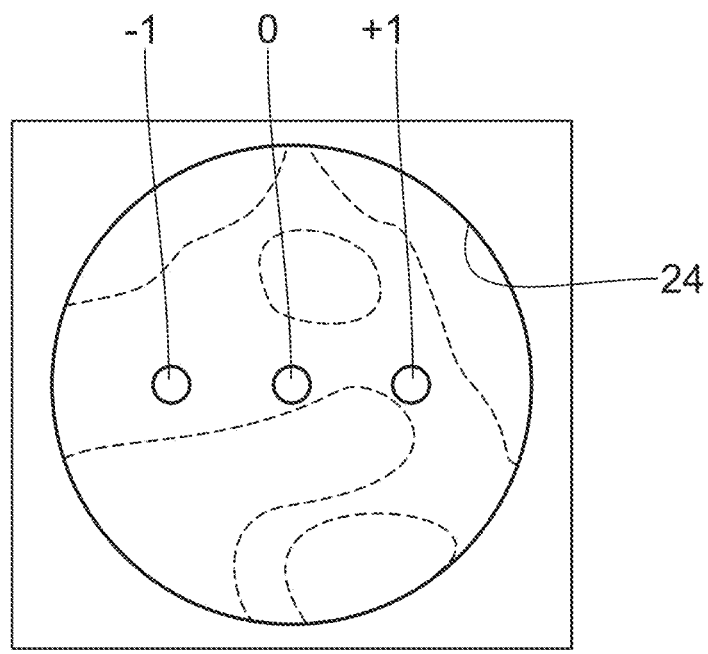
FIG. 6 shows, in a representation similar to FIG. 5, the diffraction spectrum including wavefront influences, indicated as height contours, by the imaging optical unit of the metrology system as measured spectrum in the region of an exit pupil of the imaging optical unit at VI in FIG. 1.

FIG. 6 shows a distribution of an intensity of the illumination/imaging light 1 in an exit pupil plane of the illumination optical unit 17. An exit pupil 24 represented in FIG. 6 arises as an image of the entrance pupil 22.

The pupils 22 (cf., FIG. 5) and 24 (cf., FIG. 6) are circular. The pupils 22, 24 can also deviate from the circular form in the case of alternative specifications by way of appropriate aperture stops 21, with the pupils being able to be at least approximately circular. In such a case, a pupil radius can be calculated as a mean radius. By way of example, such alternative pupils can have an elliptical design with an aspect ratio between the semi-axes ranging between 1 and, for example, 3. The pupils 22 and 24 can also be elliptical in an embodiment not depicted here.

The pupil region 19 is likewise circular or elliptical, or can be approximated by a circular region. The relationship $\sigma \leq 0.2$ means that a radius of such a circular pupil region 19 is no more than 20% of a radius of the pupil 22, 24.

The intensity distribution in the exit pupil 24 finds contributions firstly from the images of the −1st, 0th and +1st order of diffraction and secondly from an imaging contribution of the optical system, specifically of the projection optical unit 17. This imaging contribution which is elucidated in FIG. 6 by dashed height contours can be described by a transfer function of the optical system, as is yet to be explained below. Unavoidable imaging aberrations of the optical system lead to a measurable intensity of the illumination/imaging light 1 being present in the exit pupil 24, even in regions around the orders of diffraction.

The projection optical unit 17 images the test structure 5 toward a spatially resolving detection device 25 of the metrology system 2. The projection optical unit 17 is embodied as, e.g., a magnifying optical unit. For example, a magnification factor of the projection optical unit 17 can be greater than 10, can be greater than 50, can be greater than 100 and can even be greater still. As a rule, this magnification factor is less than 1000.

Figure 7:
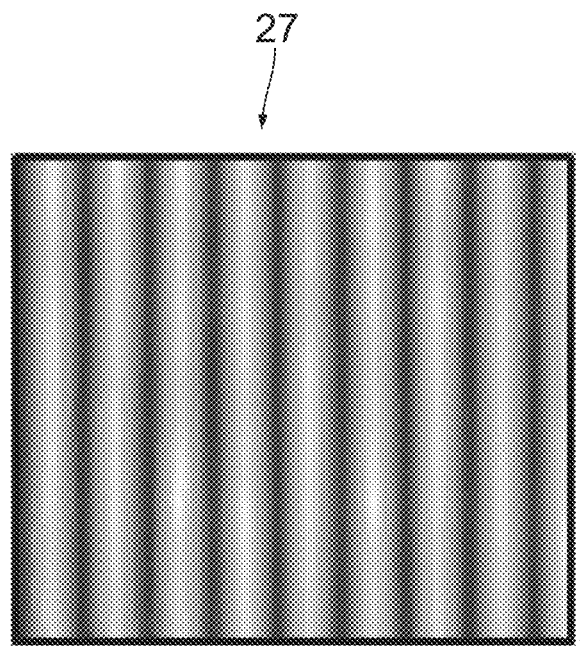
FIG. 7 shows, in a plan view similar to FIG. 3, a complex field distribution of the illumination light upon irradiation of a spatially resolving detection device of the metrology system in the illumination light beam path at VII in FIG. 1.

In accordance with FIG. 3, FIG. 7 shows a complex field distribution 27 of the illumination/imaging light 1 in the region of an image plane 26, in which the detection device 25 is arranged.

Figure 8:
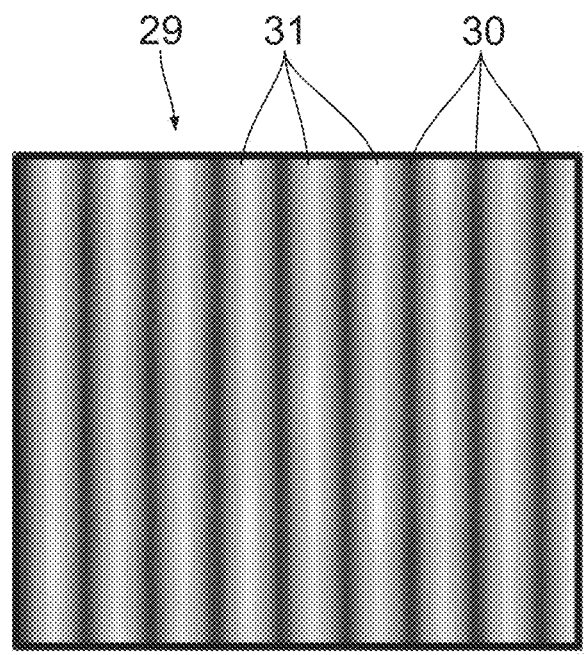
FIG. 8 shows, in a representation similar to FIG. 7, an illumination light intensity, as measured by the detection device, at the location of the detection device at VIII in FIG. 1.

FIG. 8 shows an intensity distribution 29 of the illumination/imaging light 1, as measured by the camera 25 in an image field 28. Images of the absorber lines 6 are present in the intensity distribution 29 as substantially dark lines 30 of low intensity and images of the multilayer lines 7 are present as bright lines 31 of greater intensity in the intensity distribution 29.

The detection device 25 can be designed as a charge-coupled device (CCD) camera or as a complementary metal-oxide semiconductor (CMOS) camera.

Figure 12:
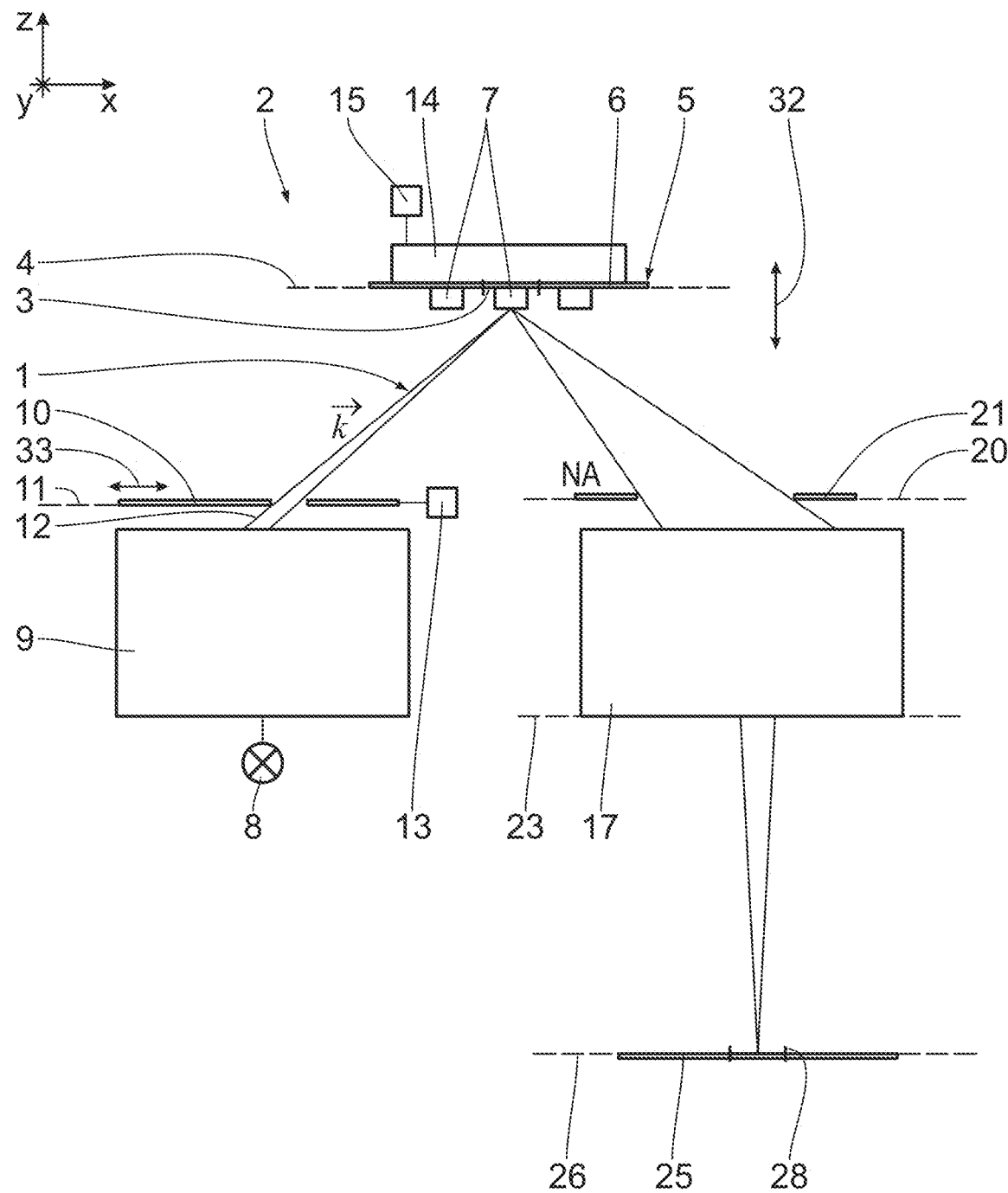
FIG. 12 shows, in a representation similar to FIG. 1, the metrology system, with additional degrees of freedom which are for components of the metrology system and which specify different measurement situations being represented.

FIG. 12 elucidates degrees of freedom which may be relevant in a method for determining an imaging quality of the optical system of the metrology system 2, specifically a z-displaceability (double-head arrow 32) of the test structure 5, brought about by driving the object displacement drive not depicted in FIG. 12, and a x/y-displaceability (double-head arrow 33) of the specification device 10 for the illumination angle distribution for illuminating the test structure 5, brought about by driving the drive unit 13 not depicted in FIG. 12.

Moreover, an aperture width of the stop of the specification device 10 can be variably specifiable by way of the drive unit 13.

FIG. 12 moreover shows the direction, as specified by the specification device 10, of a chief ray of the illumination light 1 to the test structure 5 reproduced by a vector $\bar{k}$.

In the determination of the imaging quality of the optical system of the metrology system 2, still explained in more detail below, a field distribution of the test structure 5, the diffraction spectrum of the test structure 5, that is to say the Fourier transform of the object field distribution, a point spread function of the projection optical unit 17 and its Fourier transform, a complex-valued transfer function of the projection optical unit 17, are determined from a series of measured intensity distributions in the style of the intensity distribution 29 of FIG. 8, which correspond to different z-positions of the test structure 5 and which are referred to as aerial images overall, and from a series of such aerial images.

When determining the imaging quality of the optical system of the metrology system 2, the test structure 5 is initially arranged in the object plane 4 in the object field 3 of the projection optical unit 17 by virtue of the test structure 5 being appropriately connected to the object holder 14.

Subsequently, the initial illumination angle distribution $\bar{k}_0$ is set in accordance with the centered pupil region 19 by use of the specification device 10. This initial illumination angle distribution illuminates the test structure 5 with the illumination light 1 from an illumination direction represented by the initial pupil region 19. The area of the pupil region 19 is less than 10% of the total pupil area of the entrance pupil 22. In particular, the following applies to the pupil region 19: $\sigma < 0.2$.

The specification of the initial illumination angle distribution $\bar{k}_0$, that is to say the centration of the illumination, is implemented in such a way that (cf., FIG. 12) a chief ray of the illumination light 1 corresponds with a chief ray of an imaging beam path of the projection optical unit 17. Then, the following applies by definition: $\overline{k}_0=(0,0)$ in a corresponding coordinate system of the pupils 22, 24 of the projection optical unit 17.

Now, the test structure is illuminated with this initial illumination angle distribution in different distance positions of the test structure 5 relative to the object plane 4 by use of the illumination light 1, that is to say in different z-positions of the test structure 5 which are specified by way of the object holder 14. The intensity of the illumination light 1 guided within the scope of imaging the test structure 5 into each of these z-distance positions by use of the projection optical unit 17 is measured in the image plane 26 of the projection optical unit 17 using the detection device 25 for the purposes of determining an initial measured aerial image of the test structure 5. This z-distance position is also referred to as relative focal position. Thus, a stack of intensity distributions corresponding to the intensity distribution 29 is measured for the various z-positions. By way of example, nine different z-positions of the test structure 5 can be set in this aerial image measurement. The z-range used here can sweep over a plurality of Rayleigh units (Rayleigh unit=$0.5\lambda/NA^2$, where $\lambda$ denotes the wavelength of the illumination light and NA denotes a numerical aperture of the illumination).

Each of the intensity distributions adopted at a z-distance position and corresponding to the intensity distribution 29 can be written as $I(\overline{x}, z, \overline{k}_0)$.

Here, $\overline{x}$ denotes the respective x,y-position vector within the intensity distribution, that is to say the location of a detector pixel of the projection device 25.

z denotes the respective z-distance position at which this intensity distribution is measured.

$\overline{k}_0$ denotes the initial illumination angle distribution at which this measurement is carried out.

Now, a further illumination angle distribution with a chief ray direction $\overline{k}_{-1}$ is specified for illuminating the test structure 5 by virtue of the stop of the specification device 10 being displaced. This displacement emerges from a comparison of FIGS. 9 and 10. This is such a displacement along the x-axis of the pupil 22, 24 of the projection optical unit 17 that the pupil region 19, in which the pupil 22, 24 is fully illuminated on account of the new illumination angle distribution, now comes to rest at the location of the −1st order of diffraction of the initial illumination angle distribution of FIG. 9. Thus, the following applies to the illumination direction of the now specified further illumination angle distribution:

$\underline{k}_{-1}=(-1/p, 0)$ in the x,y-coordinates of the pupil 22, 24. Here:

p=pitch/$\lambda$, with pitch=period of the test structure 5 and $\lambda$=the wavelength of the illumination/imaging light 1.

Figure 9:
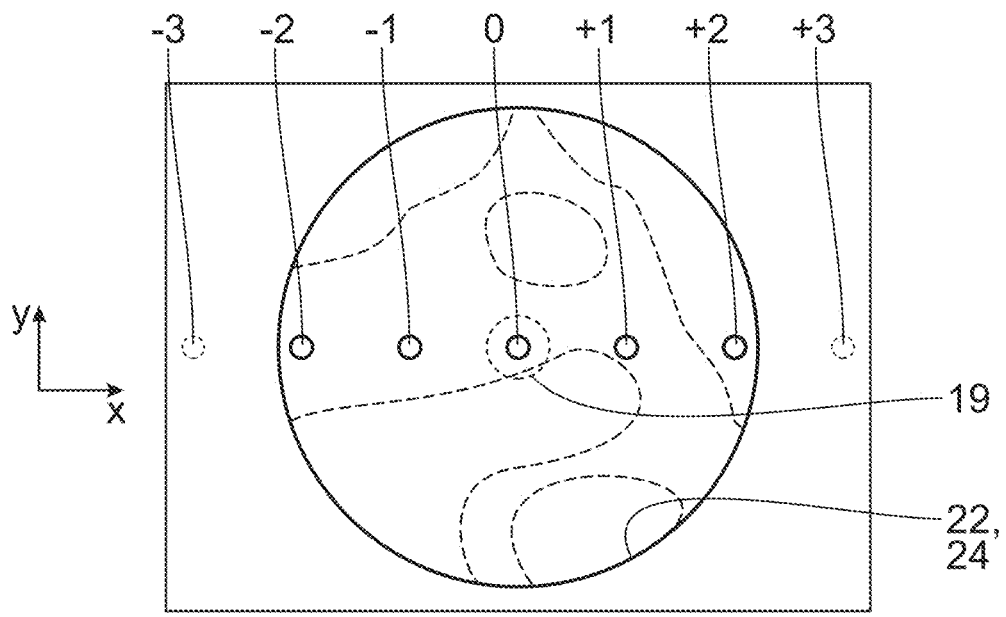
FIG. 9 shows, in a representation similar to FIG. 6, a measurement situation of the metrology system with an initial illumination angle distribution with a centered illumination of the test structure specified by a small, centered initial pupil region, with a 0th order of diffraction of the test structure being located centrally in the initial pupil region and in a center of the pupil of the metrology system as specified by the aperture stop, FIG. 9 also depicting orders of diffraction beyond a curtailment by the aperture stop.
Figure 10:
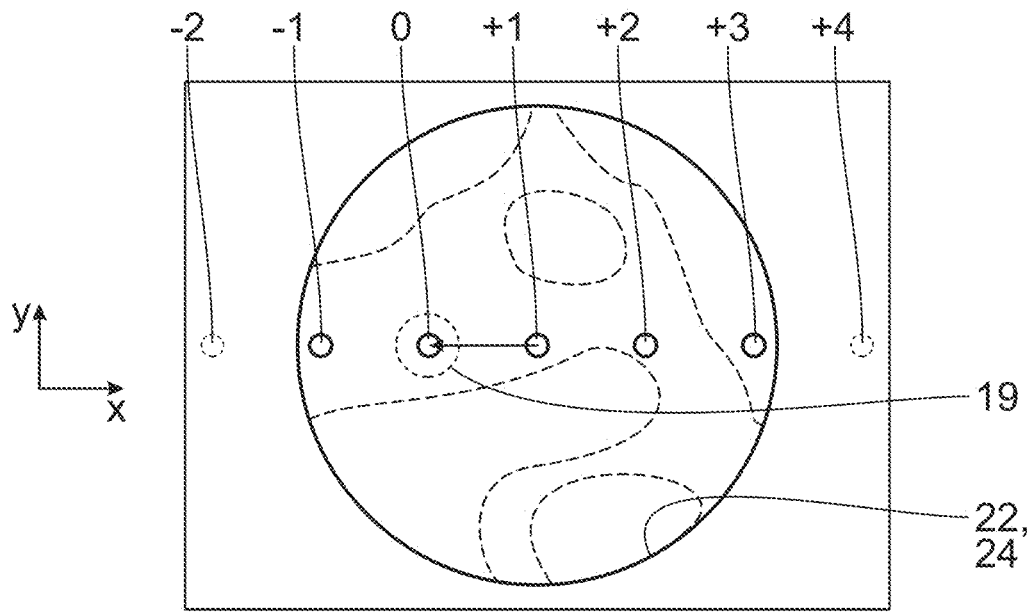
FIG. 10 shows, in a representation similar to FIG. 9, a further measurement situation of the metrology system with a further illumination angle distribution, for which the initial pupil region, and hence the 0th order of diffraction of the illumination light diffracted by the test structure, has been displaced in such a way that it is now displaced to the location of a −1st order of diffraction of the measurement situation according to FIG. 9.

A center of the pupil region 19 of FIG. 10 emerging after the displacement is therefore spaced apart from the center of the initial pupil region 19 (cf., FIG. 9) by exactly one order of diffraction of the diffraction spectrum 18.

When this further illumination angle distribution is specified, the pupil region 19 is displaced in such a way that it does not overlap with the initial pupil region (cf., the position of the pupil region 19 in FIG. 9) in the pupil 22, 24.

Subsequently, an aerial image stack is measured again in this further illumination angle distribution. Thus, the test structure 5 is illuminated at different z-distance positions of the test structure 5 relative to the object plane 4 using this further illumination angle distribution and the intensity of the illumination/imaging light 1 guided accordingly through the projection optical unit 17 is measured by the spatially resolving detection device 25 for the purposes of determining a further measured aerial image at each z-distance position. Thus, it is now an aerial image stack $I(\overline{x}, z, \overline{k}_{-1})$ that is measured.

Figure 11:
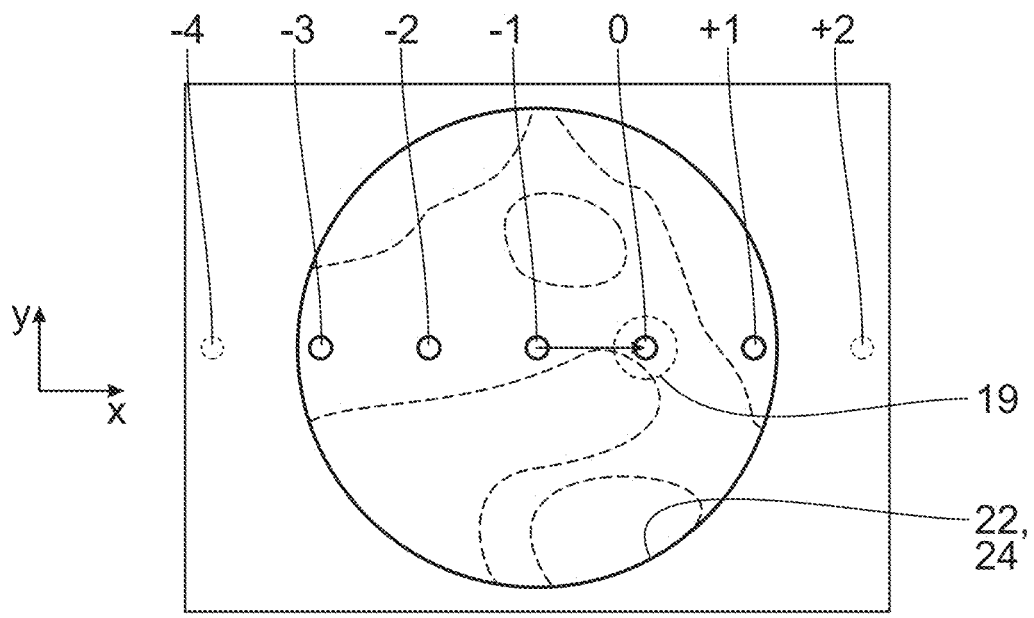
FIG. 11 shows, in a representation similar to FIG. 9, a further measurement situation of the metrology system with a further illumination angle distribution, for which the initial pupil region, and hence the 0th order of diffraction of the illumination light diffracted by the test structure, has been displaced in such a way that it is now displaced to the location of a +1st order of diffraction of the measurement situation according to FIG. 9.

Now, it is possible to specify a further illumination angle distribution, as elucidated in FIG. 11, with the pupil region 19 which reproduces the illumination direction $\overline{k}$ specified by the specification device 10 then being displaced in the positive x-direction within the pupil 22, 24 such that said pupil region comes to rest at the location of the +1st order of diffraction of the initial illumination angle distribution of FIG. 9. Thus, the illumination chief ray is displaced in the $\overline{k}_{+1}=(1/p, 0)$ direction and the aerial image stack $I(\overline{x}, z, \overline{k}_{+1})$ is measured.

What also applies here is that a center of the further pupil region 19, in accordance with FIG. 11, is spaced apart from the center of the initial pupil region (cf., FIG. 9) by exactly one order of diffraction of the diffraction spectrum 18.

Now, the imaging contribution of the optical system of the metrology system 2, that is to say of the projection optical unit 17, is determined from a comparison of these measured aerial images $I(\overline{x}, z, \overline{k})$.

To derive the computational relationships used during this determination, the imaging process in the optical system of the metrology system 2 is initially considered for a discrete illumination direction $\overline{k}$.

Let $M(\overline{s},\overline{k})$ be the complex-valued diffraction spectrum 18 for this illumination direction. In this case, $\overline{s}$ denotes the spatial frequency normalized with respect to wavelength (i.e., the dimensionless spatial frequency). $\overline{s}$ can also be interpreted as the direction of the order of diffraction or as the x,y-pupil coordinate of the order of diffraction in the pupil.

The propagation of the illumination/imaging light 1 through the projection optical unit 17 corresponds to a multiplication of this spectrum M by the likewise complex-valued transfer function of the projection optical unit $(\overline{s},z)$, which depends on the relative focal position of the object z. The following holds true:

$$T(\vec{s}, z) = T(\vec{s})P(\vec{s})e^{2\pi i \frac{z}{\lambda}\sqrt{1-s^2}} \quad (1)$$

In this case, P denotes a pupil function specified by the aperture stop 21 with the numerical aperture NA. $(\overline{s})=1$ within the NA and $(\overline{s})=0$ outside of the NA.

$(\overline{s})$ is the sought-after transfer function and the last factor in equation (1) above is the wavefront aberration caused by the known defocusing of the object.

The diffraction spectrum G at the exit pupil 24 of the projection optical unit 17 (cf., FIG. 6 as well) then is:

$$G(\vec{s}, \vec{k}) = M(\vec{s}, \vec{k})T(\vec{s})P(\vec{s})e^{2\pi i \frac{z}{\lambda}\sqrt{1-s^2}} \quad (2)$$

The image field distribution 27 emerging therefrom is the Fourier transform of this diffraction spectrum G. The camera measures the intensity I thereof (cf., the intensity distribution 29, FIG. 8, in exemplary fashion):

$$I(\vec{x}, z, \vec{k}) = \left| \int M(\vec{s}, \vec{k})T(\vec{s})P(\vec{s})e^{2\pi i \frac{z}{\lambda}\sqrt{1-s^2}} \right|^2 \quad (3)$$

In the case of a partly coherent illumination system, the illumination contains a plurality of illumination directions that are incoherent in relation to one another. A plurality of focus series with the same illumination settings but different chief ray directions $\vec{k}_n$ (e.g. $\vec{k}_0$, $\vec{k}_{-1}$, $\vec{k}_1$) are recorded during the determination method. An illumination direction-dependent weighting of the illumination angle distributions for the measurement n is $\sigma(k,\vec{k}_n)=\sigma_0(k-\vec{k}_n)$. A summation over all focus series, that is to say over all illumination settings, yields:

$$I(\vec{x},z,\vec{k}_n)=\Sigma_{\vec{k}}\sigma 0(\vec{k}-\vec{k}_n)I(\vec{x},z,\vec{k})=\Sigma_{\vec{q}}\sigma_0(\vec{q})I(\vec{x},z,\vec{q}+\vec{k}_n) \quad (4)$$

Here it holds true that: $\vec{q}=\vec{k}-\vec{k}_n$. Inserting equation (3) into equation (4) yields:

$$I(\vec{x}, z, \vec{k}_n) = \sum_{\vec{q}} \sigma_0(\vec{q}) \left| \int M(\vec{s}, \vec{q} + \vec{k}_n)T(\vec{s})P(\vec{s})e^{2\pi i \frac{z}{\lambda}\sqrt{1-s^2}} \right|^2 \quad (5)$$

Two approximations are subsequently implemented:
1) Initially, the assumption is made that the displacement of the illumination direction only leads to a displacement of the mask spectrum, i.e., $M(\vec{s},\vec{k})\approx M(\vec{s}+\vec{k})$. In the literature, such an approximation is known as a Hopkins approximation. Thus, a pure displacement of the test structure diffraction spectrum 18 in the pupil 22, 24 is included when determining the imaging contribution of the optical system in the various illumination angle distributions.
2) There is a relatively coherent illumination setting with a small <<1, e.g., $\sigma \leq 0.2$. The following arises for the weighting of the illumination angle $$\text{distribution:} \sigma_0(\vec{q}) = \begin{cases} 1 & \text{for } q \leq \sigma NA \\ 0 & \text{for } q > \sigma NA \end{cases}.$$

Furthermore, the assumption is made that the transfer function T of the optical unit changes only a little within the region defined by $\sigma$NA. That is to say, the following assumption is made: $T(\vec{s}) \approx T(\vec{s}+\vec{q})$ for q<$\sigma$NA. $\sigma$ can always be chosen to be so small that this condition is satisfied. Thus, the assumption that the transfer function T is constant for each illumination direction $\vec{k}_n$ within the respectively specified illumination angle distribution is included in the determination of the imaging contribution.

Using these approximations, the aerial image then can be written as follows:

$$I(\vec{x}, z, \vec{k}_n) = \sum_{\vec{q}} \sigma_0(\vec{q}) \left| \int M(\vec{s} + \vec{q} + \vec{k}_n)T(\vec{s} + \vec{q})P(\vec{s})e^{2\pi i \frac{z}{\lambda}\sqrt{1-s^2}} \right|^2 \quad (6)$$

Now, the spectrum S that has propagated through the optical system of the metrology system 2, that is to say through the projection optical unit 17, is introduced as a new variable:

$$S(\vec{s},\vec{k}_n)=M(\vec{s}+\vec{k}_n)T(\vec{s}) \quad (7)$$

Insertion in equation (6) results in:

$$I(\vec{x}, z, \vec{k}_n) = \sum_{\vec{q}} \sigma_0(\vec{q}) \left| \int S(\vec{s} + \vec{q}, \vec{k}_n)P(\vec{s})e^{2\pi i \frac{z}{\lambda}\sqrt{1-s^2}} \right|^2 \quad (8)$$

Thus, the spectrum S that has propagated is measured as measured spectrum when measuring the intensity within the scope of the determination method, said measured spectrum arising as the diffraction spectrum M of the periodic test structure 5 that has been guided through the optical system. The measured spectrum S is a product of the diffraction spectrum M of the periodic test structure 5 and the transfer function of the optical system.

A reconstruction of the propagated spectrum S, which is carried out separately for each measured illumination direction, is implemented as follows:
1. Start with a spectrum $S(\vec{s},\vec{k}_n)$ which, as described above, arises from the intensity measurements of the aerial image stacks of the various illumination angle distributions.
2. From this, calculate the aerial image $I(\vec{x},z,\vec{k}_n)$ from equation (8) above.
3. Vary the propagated spectrum $S(\vec{s},\vec{k}_n)$ until the difference between the aerial image calculated in the previous step 2 and the aerial images $I_{meas}$ measured using the detection device 25 at the various z-positions and with the various illumination angle distributions is minimized, that is to say the following minimization problem is solved:

$$\min_{S(\vec{s},\vec{k}_n)} \left| I(\vec{x}, z, \vec{k}_n) - I_{meas}(\vec{x}, z, \vec{k}_n) \right|^2 \quad (9)$$

A similar reconstruction step is also described in DE 10 2019 215 800 A1.

The result of the reconstruction described in the paragraph above is the optimized propagated spectrum $S(\vec{s},\vec{k}_n)$, that is to say the product of the mask spectrum displaced in the illumination direction and the transfer function T of the projection optical unit 17 (cf., equation (7) above).

Now, the two constituent parts (mask spectrum M and transfer function T) are determined from the propagated spectra (S). What is initially taken into account to this end is that the test structure 5 is periodic, that is to say the spectrum consists of discrete orders of diffraction with spatial frequencies $$\frac{l}{p},$$

where l=−Inf . . . Inf is the integer order of diffraction. What is moreover considered is that the illumination directions, that is to say the illumination angle distributions, at which the aerial image measurement was taken in each case, were each displaced by a discrete number of n orders of diffraction, specifically $$\vec{k} = \left(\frac{n}{p}, 0\right)$$

with n=0, −1, 1.

For the vertical structures considered here, the following therefore applies to the mask spectrum M:

$$M(\vec{s} + \vec{k}_n) = \sum_{l=-Inf}^{Inf} M_l \delta\left(s_x + \frac{n}{p} - \frac{l}{p}\right) \quad (10)$$

The mask spectrum M, that is to say the diffraction spectrum 18, thus is an equidistant chain of diffraction points along the x-coordinate.

Using these approximations, the reconstructed spectrum S can be written as follows by way of an insertion into equation (7):

$$S(\vec{s}, \vec{k}_n) = \sum_{l=-Inf}^{Inf} M_l \delta\left(s_x + \frac{n}{p} - \frac{l}{p}\right) T(\vec{s}) == \sum_{l=-Inf}^{Inf} M_l \delta\left(s_x + \frac{n}{p} - \frac{l}{p}\right) T_{l-n} = \sum_{l'=-Inf}^{Inf} M_{l'+n} \delta\left(s_x - \frac{l'}{p}\right) T_{l'} \quad (11)$$

The reconstructed spectra are discretized below, that is to say only the values at the location of the respective orders of diffraction are taken into account. The following arises for the l-th order of diffraction of the reconstructed spectrum with the displacement of the illumination direction by n orders of diffraction:

$$S_{n,l} = S\left(s_x = \frac{l}{p}, s_y = 0, k_x = \frac{n}{p}, s_y = 0\right) = T_l M_{n+l} \quad (12)$$

Here, n=0, −1, 1 is for the various illumination directions at which measurements were carried out and l=−L . . . L, here, L=floor(pNA) is the maximum order of diffraction within the NA, that is to say L=1 in the present example.

By taking logarithms of formula (12), the following arises:

$$\log(S_{n,l}) = \log(T_n M_{n+l}) \quad (13)$$

$$\log(S_{n,l}) = \log(T_n) + \log(M_{n+l}) \quad (14)$$

$$s_{n,l} = t_n + m_{n+l} \quad (15)$$

with $s_{n,l} = \log(S_{n,l})$, $t_n = \log(T_n)$ and $m_{n+l} = \log(M_{n+l})$. Equations (13) to (15) above can also be written in matrix form:

$$\begin{pmatrix} s_{0,-L} \\ \cdots \\ s_{0,L} \\ s_{1,-L} \\ \cdots \\ s_{1,L} \\ s_{-1,-L} \\ \cdot\cdot \\ s_{-1,L} \end{pmatrix} = \begin{bmatrix} I_{2L+1} & O_{2L+1} & I_{2L+1} & O_{2L+1} \\ I_{2L+1} & O_{2L+1} & O_{2L+1} & I_{2L+1} \\ I_{2L+1} & I_{2L+1} & O_{2L+1} & O_{2L+1} \end{bmatrix} \begin{pmatrix} t_{-L} \\ \cdots \\ t_L \\ m_{-L-l} \\ m_{-L} \\ \cdots \\ m_L \\ m_{L+1} \end{pmatrix} \quad (16)$$

$$\begin{pmatrix} s_{0,-L} \\ \cdots \\ s_{0,L} \\ s_{1,-L} \\ \cdots \\ s_{1,L} \\ s_{-1,-L} \\ \cdot\cdot \\ s_{1,L} \end{pmatrix} = \mathbb{M} \begin{pmatrix} t_{-L} \\ \cdots \\ t_L \\ m_{-L-l} \\ m_{-L} \\ \cdots \\ m_L \\ m_{L+1} \end{pmatrix} \quad (17)$$

Here, $I_{2L+1}$ is the identity matrix with (2L+1)×(2L+1) entries and $0_{2L+1}$ is a column zero vector with 2L+1 entries. The entries of the vector on the left-hand side of equations (16) and (17) are the logarithms of the complex-valued propagated spectra S that were determined from the measurements. The entries of the vector on the right-hand side are the sought-after logarithms of the mask spectrum M and the transfer function T. These sought-after logarithms of M and T can be determined from the measured values by way of the pseudo-inverse pinv of the matrix:

$$\begin{pmatrix} t_{-L} \\ \cdots \\ t_L \\ m_{-L-l} \\ m_{-L} \\ \cdots \\ m_L \\ m_{L+1} \end{pmatrix} = pinv(\mathbb{M}) \begin{pmatrix} s_{0,-L} \\ \cdots \\ s_{0,L} \\ s_{1,-L} \\ \cdots \\ s_{1,L} \\ s_{-1,-L} \\ \cdot\cdot \\ s_{1,L} \end{pmatrix} \quad (18)$$

Now, the sought-after mask spectrum M, i.e., the diffraction spectrum 18 only singled-out by the test structure 5 (cf., FIG. 4), and the transfer function T, that is to say the sought-after imaging contribution of the optical system, specifically of the projection optical unit 17, can be calculated at the sampling points defined by the order of diffraction:

$$M\left(s_x = \frac{l}{p}, s_y = 0\right) = e^{m_l} \quad (19)$$

for l=−L−1 . . . L+1. These reconstructed spectra can then be used, for example, to determine the mask phase in a manner corresponding to what is described in DE 10 2019 215 800 A1. A peculiarity of the determination method is that there is also a reconstruction of orders of diffraction located outside of the NA (in this case, for example, the order of diffraction L+1 and, in the specific exemplary embodiment, the orders of diffraction including the order +/−2). Even higher orders of diffraction could be reconstructed by way of a further displacement of the illumination direction.

$$T\left(s_x = \frac{l}{p}, s_y = 0\right) = e^{t_l} \quad (20)$$

for l = −L ... L.

Thus, the transfer function T is reconstructed in terms of amplitude and phase.

The amplitude of the transfer function reflects the apodization while the phase reflects the wavefront aberration. The apodization and the wavefront aberration represent examples of an imaging quality parameter which can be determined from the determined imaging contribution.

The transfer function between the orders of diffraction can optionally be determined by interpolation such that the imaging contribution is also determined for directions of the imaging light through the projection optical unit 17 which do not correspond to the directions of the orders of diffraction of the test structure 5.

Using the example of a test structure 5 with a period along one coordinate, specifically along the x-coordinate, discussed up to this point, it is possible to reconstruct the transfer function T at the orders of diffraction on the x-axis. To determine the transfer function over the entire pupil, use can be made of a test structure 5 that is periodic in two dimensions, that is to say both along the x-coordinate and along the y-coordinate. Examples of such a two-dimensionally periodic test structure 5 are 2-D periodic structures such as a grid of contact holes. Such a grid of contact holes can be designed as a periodic 2-D arrangement of circles (pinholes, pinhole apertures) or squares.

Figure 13:
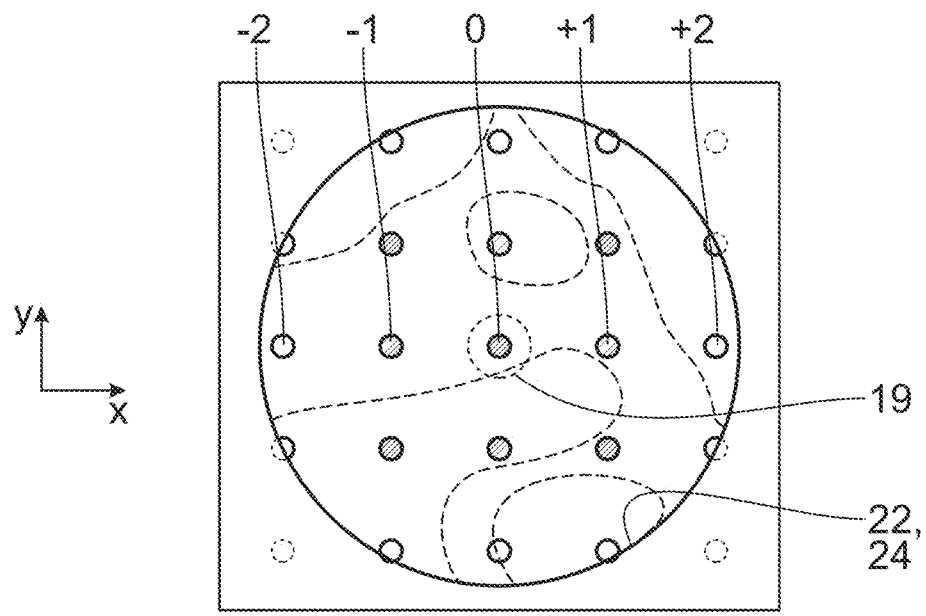
FIG. 13 shows, in a representation similar to FIG. 9, the diffraction spectrum of a two-dimensional binary periodic test structure during an initial measurement situation, an initial illumination angle distribution being chosen such that a 0th order of diffraction of the test structure as specified by the initial pupil region is located centrally in a pupil of the metrology system as specified by the aperture stop.
Figure 14:
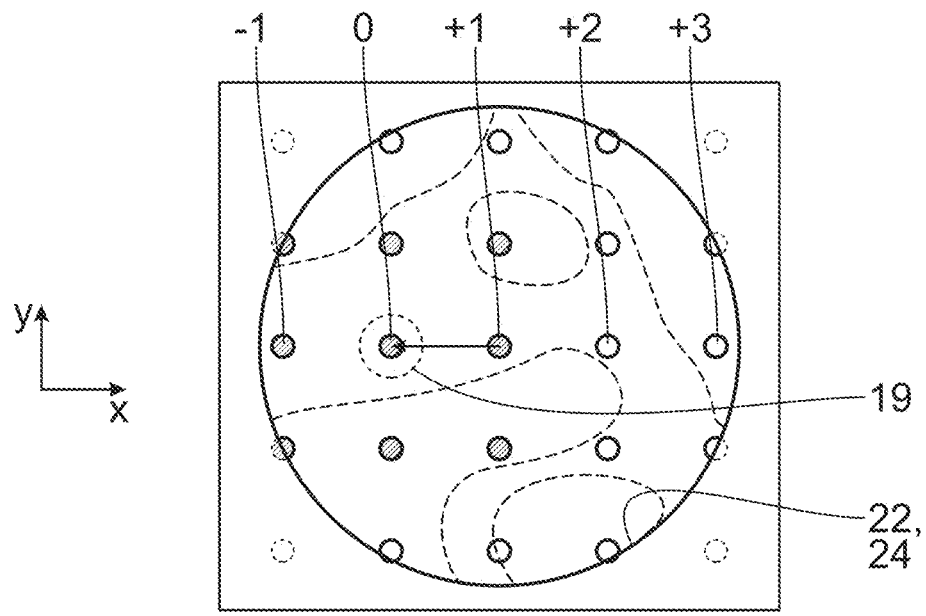
FIG. 14 shows, in a representation similar to FIG. 10, the diffraction spectrum according to FIG. 13 during a further measurement situation with an illumination angle distribution, for which the initial pupil region, and hence the 0th order of diffraction, has been displaced in the horizontal direction to the location of the −1st order of diffraction according to FIG. 13.
Figure 15:
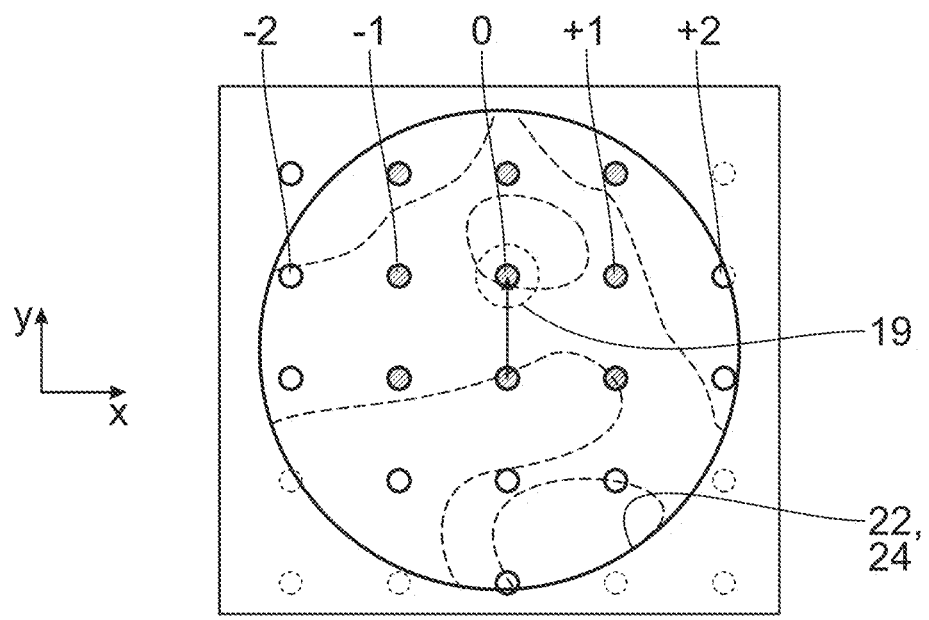
FIG. 15 shows, in a representation similar to FIGS. 13 and 14, the diffraction spectrum during a further measurement situation with a further illumination angle distribution, for which the diffraction spectrum of the two-dimensional test structure has been displaced in the vertical direction in such a way that the initial pupil region, and hence the 0th order of diffraction, is located at the location of the +1st order of diffraction in the vertical direction.

As illustrated in FIGS. 13 to 15, the orders of diffraction are distributed over the entire pupil 22, 24 in this case. In this case, within the scope of specifying the respective further illumination angle distribution, the illumination directions are displaced first by one or more orders of diffraction in the x-direction and subsequently by one or more orders of diffraction in the y-direction when the determination method is carried out.

Once again, FIG. 13 represents the initial illumination angle distribution, in which the pupil region 19 is arranged at the center of the pupil 22, 24, and consequently the order of diffraction (x=0, y=0), i.e., (0,0), is as well. FIG. 13 also represents further orders of diffraction (x, y) with −3≤x≤3 and −2≤y≤2.

FIG. 14 shows the further illumination angle distribution, which arises by displacing the pupil region 19 of the illumination/imaging light 1 to the location of the (−1,0) order of diffraction by way of the specification device 10.

FIG. 15 shows the further illumination angle distribution, which arises by displacing the pupil region 19 of the illumination by the illumination/imaging light 1 to the location of the initial (0,1) order of diffraction by way of the specification device 10.

Accordingly, the method described above can be used to determine the mask spectrum M and the transfer function T, initially at the location of the orders of diffraction (x, y) and also between the orders of diffraction by interpolation.

In principle, the reconstruction is implemented in a manner analogous to the 1-D case. As a result of the displacement in the x- and y-directions, the matrix in formulas (16), (17) has a form with a greater number of entries.

In some implementations, the various computations and/or processing of data (e.g., aerial image data, imaging contribution) described in this document can be implemented by one or more computers according to the principles described above. For example, determining an imaging contribution of the optical system from a comparison of the measured aerial images, determining at least one imaging quality parameter from the measured imaging contribution, and/or determining a complex-valued diffraction spectrum of the test structure from the measured imaging contribution, can be implemented by one or more computers according to the principles described above. In some examples, the processing of data can be performed by one or more cloud computer servers. The one or more computers can include one or more data processors for processing data, one or more storage devices for storing data, such as one or more databases, and/or one or more computer programs including instructions that when executed by the evaluation unit causes the evaluation unit to carry out the processes. The computer can include one or more input devices, such as a keyboard, a mouse, a touchpad, and/or a voice command input module, and one or more output devices, such as a display, and/or an audio speaker. The computer can show graphical user interfaces on the display to assist the user.

In some implementations, the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processing of data described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described in a particular order, this should not be understood as requiring that such operations be performed in the particular order described or in sequential order, or that all described operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the invention have been described. Other embodiments are within the scope of the following claims. In addition, the actions recited in the claims can be performed in a different order and still achieve desirable results.

What is claimed is:

1. A method for determining an imaging quality of an optical system when illuminated by illumination light within a pupil to be measured of the optical system and/or for qualifying the phase effect of a test structure, the method comprising:
    arranging a test structure that is periodic in at least one dimension in an object plane of the optical system,
    specifying an initial illumination angle distribution for illuminating the test structure with the illumination light, represented by a contiguous, fully illuminated initial pupil region, the area of which is less than 10% of a total pupil area of the pupil,
    illuminating the test structure with the specified initial illumination angle distribution at different distance positions of the test structure relative to the object plane,
    measuring an intensity of the illumination light in an image plane of the optical system using a spatially resolving detection device for the purposes of determining an initial measured aerial image of the test structure, the illumination light having been guided by the optical system when imaging the test structure in each distance position,
    specifying a further illumination angle distribution for illuminating the test structure with the illumination light, represented by a contiguous, fully illuminated further pupil region, the area of which is less than 10% of a total pupil area of the pupil, with the further pupil region not overlapping with the initial pupil region,
    illuminating the test structure with the specified further illumination angle distribution at different distance positions of the test structure relative to the object plane,
    measuring an intensity of the illumination light in the image plane of the optical system using the spatially resolving detection device for the purposes of determining a further measured aerial image of the test structure, the illumination light having been guided by the optical system when imaging the test structure in each distance position,
    determining an imaging contribution of the optical system to the measured aerial images of the test structure from a comparison of the measured aerial images with calculated aerial images and varying parameter values affecting the calculated aerial images to determine parameter values that reduce a difference between the measured aerial images and the calculated aerial images, wherein the measured aerial images include the initial measured aerial images of the test structure measured at multiple distance positions using the initial illumination angle distribution and the further measured aerial images of the test structure measured at multiple distance positions using the further illumination angle distribution,
    determining at least one imaging quality parameter from the determined imaging contribution of the optical system, and/or
    determining a complex-valued diffraction spectrum of the test structure from the determined imaging contribution of the optical system.

2. The method of claim 1, wherein the pupil has an at least circular or elliptical edge, the pupil region representing the respective illumination angle distribution being able to be at least approximated by a circular or elliptical region with a radius that is no more than 30% of a radius of the pupil.

3. The method of claim 1, wherein the steps of "specifying a further illumination angle distribution," "illuminating the test structure with the specified further illumination angle distribution" and "measuring an intensity of the illumination light in the image plane of the optical system using the spatially resolving detection device for the purposes of determining a further measured aerial image of the test structure" are repeated at least once.

4. The method of claim 1, wherein a measured spectrum is measured within the scope of measuring the intensity and measured as a diffraction spectrum of the periodic test structure guided through the optical system.

5. The method of claim 4, wherein a pure displacement of the test structure diffraction spectrum in the pupil is included in the determination of the imaging contribution at the various illumination angle distributions ($\vec{k}$).

6. The method of claim 1, wherein a transfer function of the optical system is reconstructed in amplitude and phase when determining the imaging contribution.

7. The method of claim 4, wherein a reconstruction of the measured spectrum is included in the determination of the imaging contribution.

8. The method of claim 7, wherein a difference between a measured aerial image and an aerial image that depends on the measured spectrum to be reconstructed is minimized during the reconstruction of the measured spectrum.

9. The method of claim 6, wherein both of the diffraction spectrum of the periodic test structure and the transfer function of the optical system are included in the measured spectrum, the determination of the imaging contribution including the assumption that the transfer function is constant for each illumination direction within the respectively specified illumination angle distribution.

10. The method of claim 1, wherein a center of the further pupil region is spaced apart from a center of the initial pupil region by exactly one order of diffraction of a diffraction spectrum of the test structure.

11. The method of claim 1, wherein one of the pupil regions is located in the center of the pupil.

12. The method of claim 1, wherein the respective illumination angle distribution is specified by positioning a stop in an illumination beam path in front of the optical system.

13. A metrology system configured to carry out the method of claim 1, comprising
a holder for the test structure,
a light source configured to provide illumination light,
a specification device for specifying the illumination angle distributions,
the optical system to be examined in respect of its imaging quality,
a spatially resolving detection device for measuring the intensity of the illumination light in the image plane, and
a data processor configured to process the aerial images according to claim 1, including determining the imaging contribution of the optical system to the measured aerial images of the test structure from the comparison of the measured aerial images with calculated aerial images and varying parameter values affecting the calculated aerial images to determine parameter values that reduce the difference between the measured aerial images and the calculated aerial images, wherein the measured aerial images include the initial measured aerial images of the test structure measured at multiple distance positions using the initial illumination angle distribution and the further measured aerial images of the test structure measured at multiple distance positions using the further illumination angle distribution.

14. The metrology system of claim 13, wherein the specification device is embodied as a stop that is displaceable in driven fashion and is located in an illumination light beam path in front of the object plane.

15. The metrology system of claim 13, comprising a light source for the illumination light.

16. The metrology system of claim 13, wherein the pupil has an at least circular or elliptical edge, the pupil region representing the respective illumination angle distribution being able to be at least approximated by a circular or elliptical region with a radius that is no more than 30% of a radius of the pupil.

17. The metrology system of claim 13, wherein the metrology system is configured to repeat the steps of "specifying a further illumination angle distribution," "illuminating the test structure with the specified further illumination angle distribution" and "measuring an intensity of the illumination light in the image plane of the optical system using the spatially resolving detection device for the purposes of determining a further measured aerial image of the test structure" at least once.

18. The metrology system of claim 13, wherein the metrology system is configured to measure a measured spectrum within the scope of measuring the intensity and measured as a diffraction spectrum of the periodic test structure guided through the optical system.

19. A metrology system, comprising
a holder configured to hold a test structure that is periodic in at least one dimension in an object plane of the optical system;
a light source configured to provide illumination light;
a specification device configured to specify a plurality of illumination angle distributions during different time periods;
an optical system to be examined in respect of its imaging quality;
a spatially resolving detection device configured to measure an intensity of the illumination light in an image plane of the optical system;
a storage device storing instructions;
at least one data processor configured to execute the instructions to implement a process comprising:
controlling the specification device to specify the plurality of illumination angle distributions during different time periods for illuminating the test structure with illumination light;
causing the test structure to move to different distance positions relative to the object plane while illuminating the test structure with the plurality of specified illumination angle distributions during different time periods;
controlling the spatially resolving detection device to measure intensity values of the illumination light in an image plane of the optical system and determining a plurality of measured aerial images of the test structure for various combinations of the illumination angle distributions and the distance positions of the test structure relative to the object plane, the illumination light having been guided by the optical system when imaging the test structure in each distance position;
determining an imaging contribution of the optical system to the measured aerial images of the test structure from a comparison of the measured aerial images with calculated aerial images and varying parameter values affecting the calculated aerial images to determine parameter values that reduce a difference between the measured aerial images and the calculated aerial images, wherein the measured aerial images include the initial measured aerial images of the test structure measured at multiple distance positions using the initial illumination angle distribution and the further measured aerial images of the test structure measured at multiple distance positions using the further illumination angle distribution;
determining at least one imaging quality parameter from the measured imaging contribution of the optical system; and/or determining a complex-valued diffraction spectrum of the test structure from the measured imaging contribution of the optical system.

20. The metrology system of claim 19, wherein a first of the plurality of illumination angle distributions is represented by a contiguous, fully illuminated first pupil region, the area of which is less than 10% of a total pupil area of the pupil, and a second of the plurality of illumination angle distributions is represented by a contiguous, fully illuminated second pupil region, the area of which is less than 10% of the total pupil area of the pupil, and the second pupil region does not overlap with the first pupil region.

21. The method of claim 1, comprising determining the at least one imaging quality parameter from the imaging contribution of the optical system.

22. The method of claim 21, wherein determining the imaging contribution of the optical system comprises determining a transfer function of the optical system, wherein the amplitude of the transfer function represents an apodization of the optical system, and the phase of the transfer function represents a wavefront aberration of the optical system, wherein the at least one imaging quality parameter comprise the apodization and the wavefront aberration of the optical system.

23. The method of claim 1, wherein the comparison of the measured aerial images comprises an illumination direction-dependent weighting of the illumination angle distributions for the respective measurements of the measured aerial images.

24. The method of claim 23, wherein determining the imaging contribution of the optical system from the comparison of the measured aerial images comprises a determination of a transfer function T of the optical system and of a test structure diffraction spectrum.

25. The method of claim 1, wherein determining the at least one imaging quality parameter from the determined imaging contribution of the optical system comprises evaluating an amplitude and/or a phase of a transfer function of the optical system.

26. The method of claim 1, wherein determining the complex-valued diffraction spectrum of the test structure from the determined imaging contribution of the optical system comprises a discretisation of reconstructed spectra which themselves depend on the mask structure spectra.

* * * * *